United States Patent
Yamamoto

(10) Patent No.: US 9,037,427 B2
(45) Date of Patent: May 19, 2015

(54) INFORMATION PROCESSING APPARATUS AND METHOD FOR PREDICTING REMAINING AMOUNT OF BATTERY CHARGE

(75) Inventor: Tatsuya Yamamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 601 days.

(21) Appl. No.: 13/439,054

(22) Filed: Apr. 4, 2012

(65) Prior Publication Data

US 2012/0310564 A1 Dec. 6, 2012

(30) Foreign Application Priority Data

Jun. 1, 2011 (JP) .................................. 2011-123620

(51) Int. Cl.
*G01R 31/36* (2006.01)

(52) U.S. Cl.
CPC ...................................... *G01R 31/36* (2013.01)

(58) Field of Classification Search
CPC ...................................................... G01R 31/36
USPC ............................................................. 702/63
See application file for complete search history.

(56) References Cited

U.S. PATENT DOCUMENTS

2010/0082943 A1* 4/2010 Yamamoto ....................... 712/43
2012/0131367 A1* 5/2012 Kamijima ...................... 713/323

FOREIGN PATENT DOCUMENTS

JP              8-126216          5/1996

* cited by examiner

*Primary Examiner* — Bryan Bui
(74) *Attorney, Agent, or Firm* — Staas & Halsey LLP

(57) ABSTRACT

An information processing apparatus driven by a battery, includes: a recording unit configured to record a value representing a magnitude of a load of the information processing apparatus; a determining unit configured to determine a lower threshold related to the load based on the value; a control unit configured to activate a program based on an amount of increase in the load caused by activation of the program, when the value is smaller than the lower threshold; and a calculating unit configured to calculate remaining time of the battery by using a function associated with a slope representing change in the value.

15 Claims, 21 Drawing Sheets

FIG. 7

| NUMBER | ACTIVATION FLAG | CPU USAGE RATE | SLOPE |
|---|---|---|---|
| 1 | 0 | 0 | — |
| 2 | 0 | 20 | — |
| 3 | 1 | 25 | 0.5 |
| | | | |

FIG. 9

| UPPER THRESHOLD | LOWER THRESHOLD | LOWER THRESHOLD RATIO | THRESHOLD DIFFERENCE (UPPER THRESHOLD − LOWER THRESHOLD) |
|---|---|---|---|
| 250 | 62.5 | 0.25 | 187.5 |

FIG. 10

| APPLICATION NAME | DIFFERENCE VALUE |
|---|---|
| A | 20 |
| B | 30 |
| C | 20 |
| D | 30 |
| E | 45 |
| ... | ... |

FIG. 15

| SLOPE | FUNCTION |
|---|---|
| 10 | $y = \exp(-5t) + t + w_0$ |
| 15 | $y = \exp(-5t) + t + w_1$ |
| ⋮ | ⋮ |

24

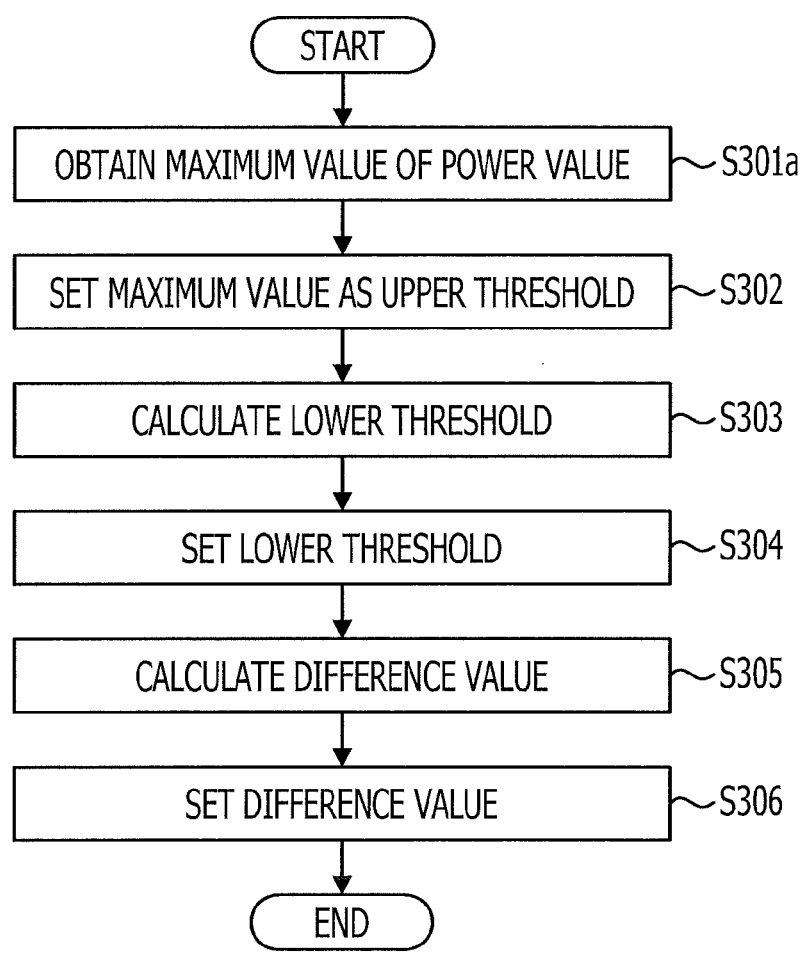

INFORMATION PROCESSING APPARATUS AND METHOD FOR PREDICTING REMAINING AMOUNT OF BATTERY CHARGE

CROSS-REFERENCE TO RELATED APPLICATION

This application is based upon and claims the benefit of priority of the prior Japanese Patent Application No. 2011-123620, filed on Jun. 1, 2011, the entire contents of which are incorporated herein by reference.

FIELD

The embodiments discussed herein are related to an information processing apparatus and a method for predicting a remaining amount of battery charge.

BACKGROUND

Highly accurate analysis of power consumption may be performed to control the power consumption of mobile apparatuses, such as smart phones or mobile phones. The control of power consumption in apparatuses driven by a battery, such as mobile phones, may be performed based on a predicted value of remaining battery time.

Examples of the related art are disclosed in Japanese Laid-open Patent Publication No. H8-126216 and so forth.

SUMMARY

According to one aspect of the embodiments, an information processing apparatus driven by a battery, comprising: a recording unit configured to record a value representing a magnitude of a load of the information processing apparatus; a determining unit configured to determine a lower threshold related to the load based on the value; a control unit configured to activate a program based on an amount of increase in the load caused by activation of the program, when the value is smaller than the lower threshold; and a calculating unit configured to calculate remaining time of the battery by using a function associated with a slope representing change in the value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates an exemplary transition recording table;

FIG. 9 illustrates an exemplary threshold information management table;

FIG. 10 illustrates an exemplary application-load correlation table;

FIG. 15 illustrates an exemplary function table;

FIG. 21 illustrates an exemplary threshold setting process.

DESCRIPTION OF EMBODIMENTS

Power consumption in a certain period is measured, and remaining battery time is predicted based on a prediction function (prediction curve) of remaining battery time obtained through calculation based on parameter fitting.

Figure 1:
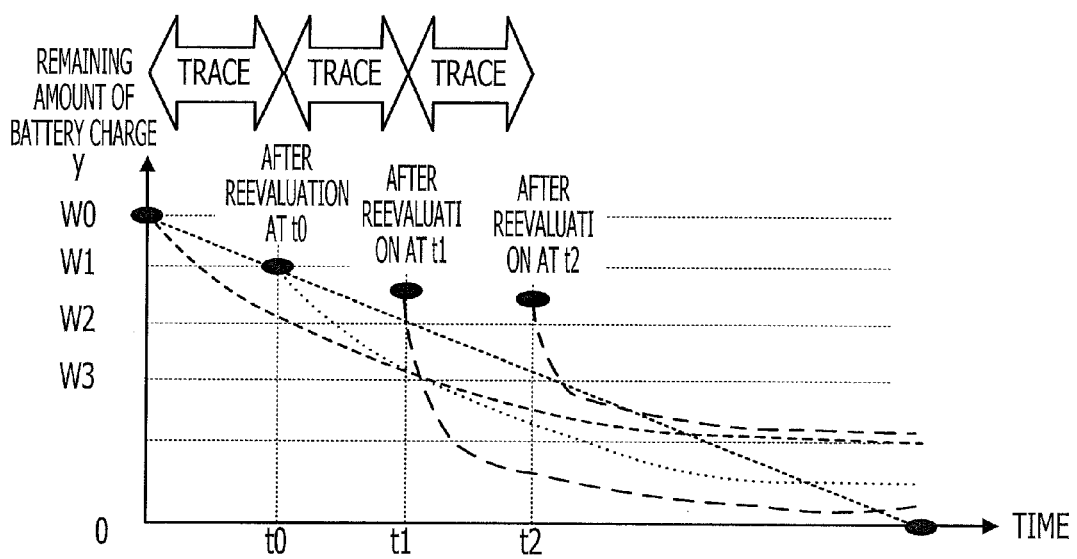
FIG. 1 illustrates an exemplary prediction function of remaining battery time.

For example, FIG. 1 illustrates an exemplary prediction function of remaining battery time. The prediction functions illustrated in FIG. 1 may be calculated based on parameter fitting.

A prediction function is obtained at time 0, and a prediction function is obtained at each of times t0, t1, and t2 based on a result of tracing power consumption or the like from the previous prediction time. Remaining battery time may be calculated based on a prediction function obtained at each time point.

In the calculation of a prediction function based on parameter fitting, CPU power and calculation time may increase.

Figure 2:
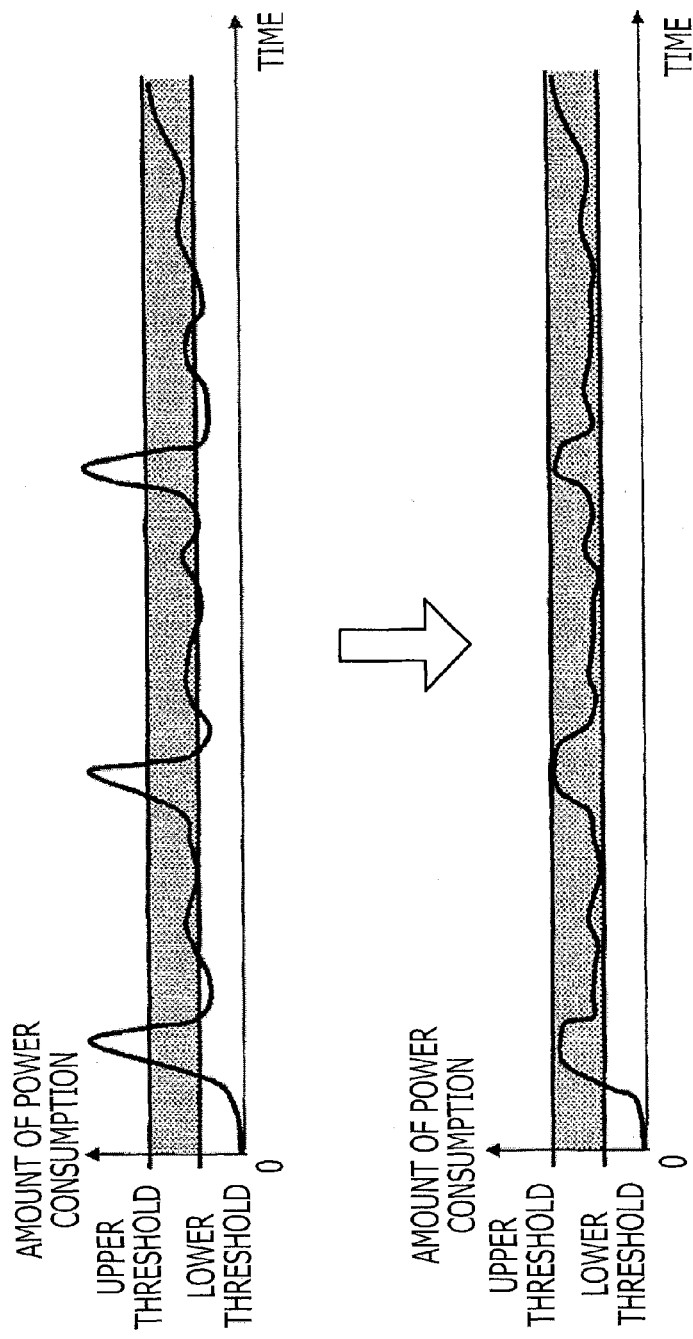
FIGS. 2A and 2B illustrate an exemplary method for predicting remaining battery time.
Figure 3:
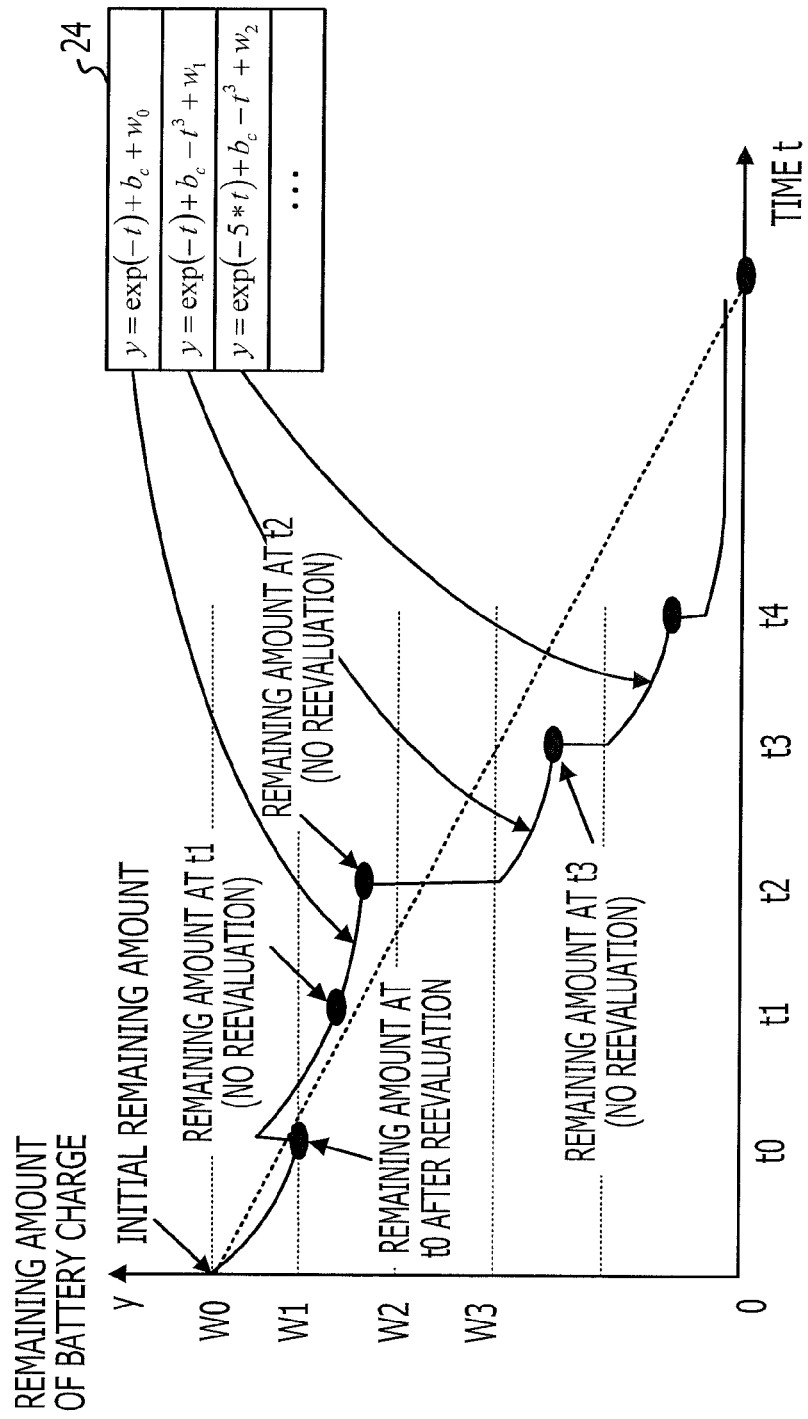
FIG. 3 illustrates an exemplary method for predicting remaining battery time.

FIGS. 2A, 2B, and 3 illustrate an exemplary method for predicting remaining battery time.

FIG. 2A illustrates an amount of power consumption of an information processing apparatus driven by current supplied from a battery. An upper threshold and a lower threshold of the amount of power consumption may be set.

For example, as illustrated in FIG. 2B, the amount of power consumption may be controlled so as to be within a range from a lower threshold to an upper threshold.

In a situation where the process illustrated in FIG. 2B is continued, a remaining amount of battery charge (remaining battery time) may be predicted by using a function stored in a function table 24 illustrated in FIG. 3, for example. The function to be used may be selected based on a slope representing transition of the amount of power consumption at a time point where the function is to be used, for example, t0, t1, t2, t3, etc. illustrated in FIG. 3. For example, the function table 24 may store a function associated with a slope.

For example, a slope of the amount of power consumption may be a slope of the curve illustrated in FIG. 2B. The amount of power consumption is controlled so as to be within the range from the lower threshold to the upper threshold, and thus the range of the slope may be limited. Generation of prediction functions may be dynamically reduced in accordance with the operation status of the information processing apparatus. Remaining battery time may be predicted by using a function recorded in the function table 24. Since the amount of power consumption is controlled so as to be within the range from the lower threshold to the upper threshold, the number of types of functions recorded in the function table 24 may be reduced. Accordingly, the amount of calculation for predicting remaining battery time may be reduced.

Figure 4:
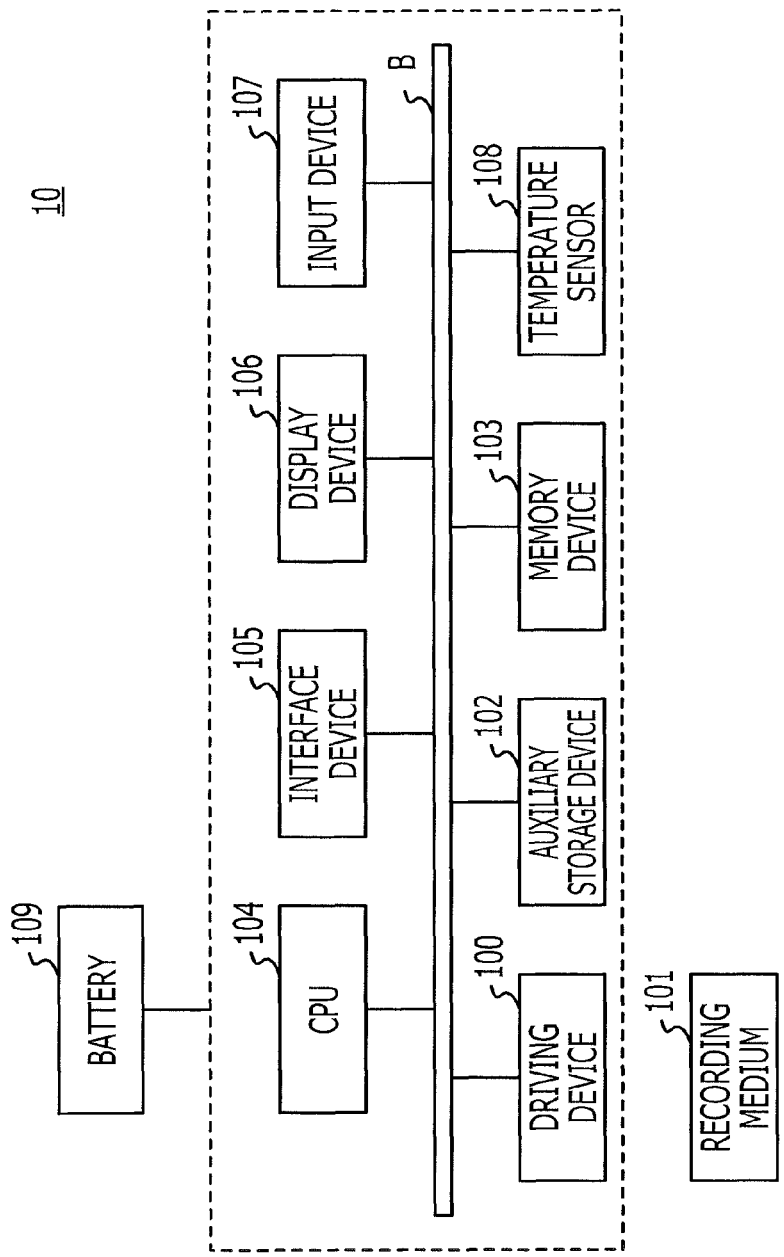
FIG. 4 illustrates an exemplary information processing apparatus.

FIG. 4 illustrates an exemplary information processing apparatus. FIG. 4 may illustrate the hardware configuration of the information processing apparatus. The information processing apparatus 10 illustrated in FIG. 4 includes a driving device 100, an auxiliary storage device 102, a memory device 103, a central processing unit (CPU) 104, an interface device 105, a display device 106, an input device 107, and a temperature sensor 108, which are connected to one another via a bus B, and a battery 109.

A program executed by the information processing apparatus 10 may be provided via a recording medium 101. When the recording medium 101 containing the program is set into the driving device 100, the program is installed from the recording medium 101 to the auxiliary storage device 102 via the driving device 100. The program may be downloaded from another computer via a network. The auxiliary storage device 102 may store a file, data, or the like together with the installed program.

The memory device 103 reads the program from the auxiliary storage device 102 in response to an instruction to start the program. The CPU 104 may execute the program stored in the memory device 103. The interface device 105 may be an interface used for coupling to a network. The display device 106 displays a graphical user interface (GUI) or the like of the program. The input device 107 includes a keyboard, a mouse, or the like, and receives an operation instruction.

The temperature sensor 108 measures temperature outside the information processing apparatus 10. The battery 109 supplies current to each of the hardware devices illustrated in FIG. 4. The battery 109 may be a secondary battery (storage battery or rechargeable battery), or may be a non-rechargeable battery.

The recording medium 101 may include a portable recording medium, such as a compact disc read only memory (CD-ROM), a digital versatile disc (DVD), or a universal serial bus (USB) memory. The auxiliary storage device 102 may include a hard disk drive (HDD), a flash memory, or the like. The recording medium 101 and the auxiliary storage device 102 may correspond to a computer-readable recording medium.

Figure 5:
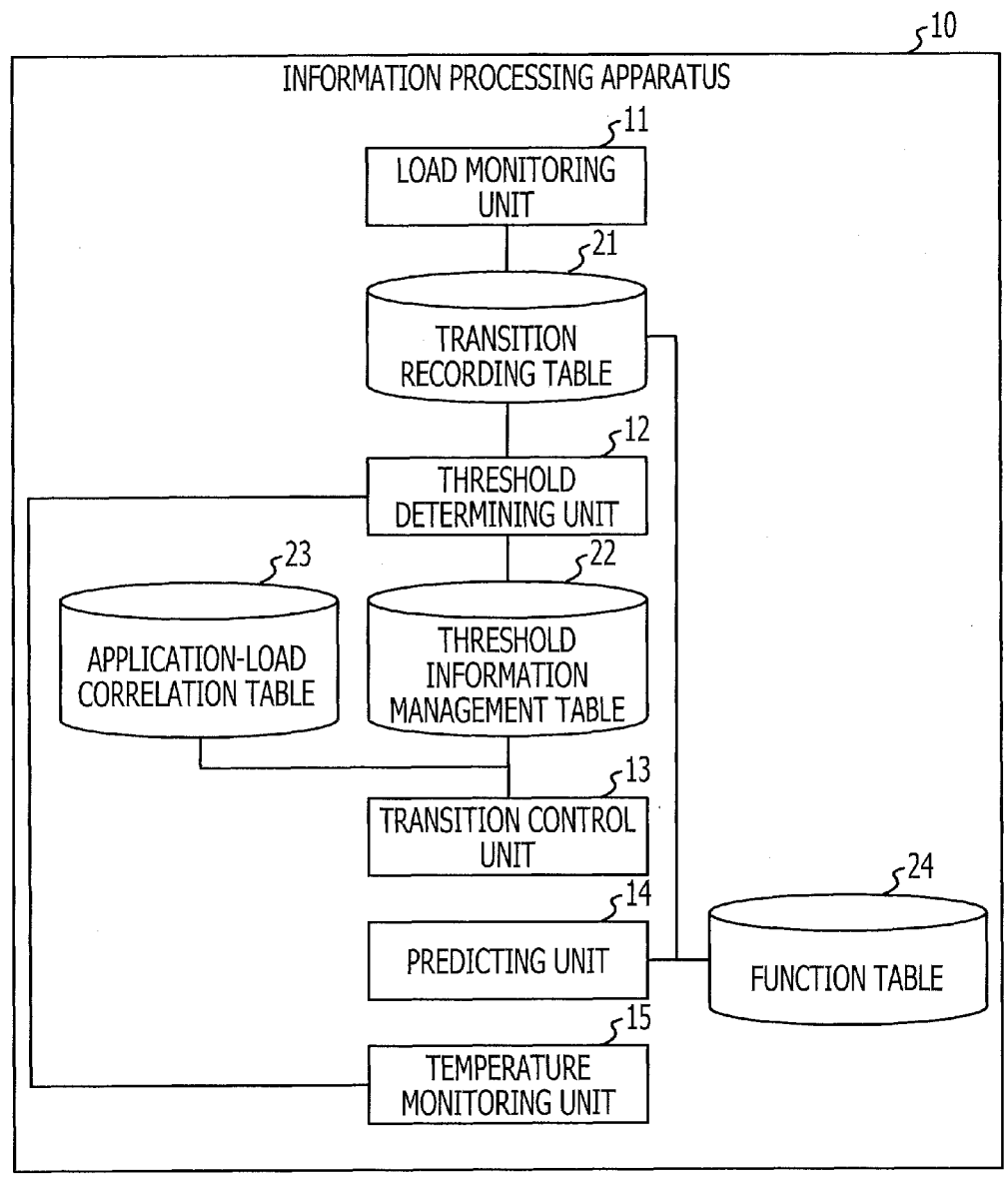
FIG. 5 illustrates an exemplary function of the information processing apparatus.

FIG. 5 illustrates an exemplary function of an information processing apparatus. The information processing apparatus 10 includes a load monitoring unit 11, a threshold determining unit 12, a transition control unit 13, a predicting unit 14, and a temperature monitoring unit 15. A program installed to the information processing apparatus 10 may be executed by the CPU 104, and a hardware circuit may execute the functions illustrated in FIG. 5. The information processing apparatus 10 includes a transition recording table 21, a threshold information management table 22, an application-load correlation table 23, and the function table 24. These tables may correspond to the auxiliary storage device 102, for example.

The load monitoring unit 11 may monitor a value representing a magnitude of a load of the information processing apparatus 10. The value representing a magnitude of a load of the information processing apparatus 10 may be a CPU usage rate. For example, transition of an amount of power consumption (power value) may be estimated based on transition of a CPU usage rate.

The load of measuring power is high, and thus measurement of power may not be performed periodically. There may be a correlation between a CPU usage rate and an amount of power consumption. The load of obtaining a CPU usage rate may be lower than the load of measuring an amount of power consumption. Thus, transition of a CPU usage rate may be used for estimating transition of an amount of power consumption. For example, transition of an amount of power consumption may be estimated by using transition of another type of load, such as an amount of memory usage.

The load monitoring unit 11 obtains a CPU usage rate at regular intervals, and records the obtained CPU usage rate into the transition recording table 21. The transition or history of the CPU usage rate is recorded in the transition recording table 21.

The threshold determining unit 12 determines an upper threshold and a lower threshold of the CPU usage rate by referring to the transition recording table 21. The threshold determining unit 12 records the upper threshold, the lower threshold, etc. into the threshold information management table 22.

The transition control unit 13 performs control the CPU usage rate to be within the range from the lower threshold to the upper threshold. For example, when the CPU usage rate is under the lower threshold, the transition control unit 13 activates a program of an application or the like, so as to increase the CPU usage rate. When the CPU usage rate exceeds the upper threshold, the transition control unit 13 stops a program of an application or the like, so as to decrease the CPU usage rate. The application to be activated or stopped may be selected based on the application-load correlation table 23. In the application-load correlation table 23, a value of difference between a CPU usage rate before activation of an application and a CPU usage rate after activation of the application is recorded for each application. For example, in the application-load correlation table 23, an amount of increase in CPU usage rate when an application is activated may be recorded for each application.

The predicting unit 14 selects a function recorded in the function table 24 based on the information recorded in the transition recording table 21, and predicts the remaining time of the battery 109 by using the selected function.

The temperature monitoring unit 15 monitors temperature outside the information processing apparatus 10. When detecting a change in temperature of a certain value or more, the temperature monitoring unit 15 causes the threshold determining unit 12 to set an upper threshold and a lower threshold again. For example, supply of current from the battery 109 is caused by chemical reactions. Thus, when the temperature suddenly changes, the output level of current may temporarily decrease. The upper threshold or the lower threshold may be modified in accordance with a change in temperature based on the temperature characteristics of the battery 109.

Figure 6:
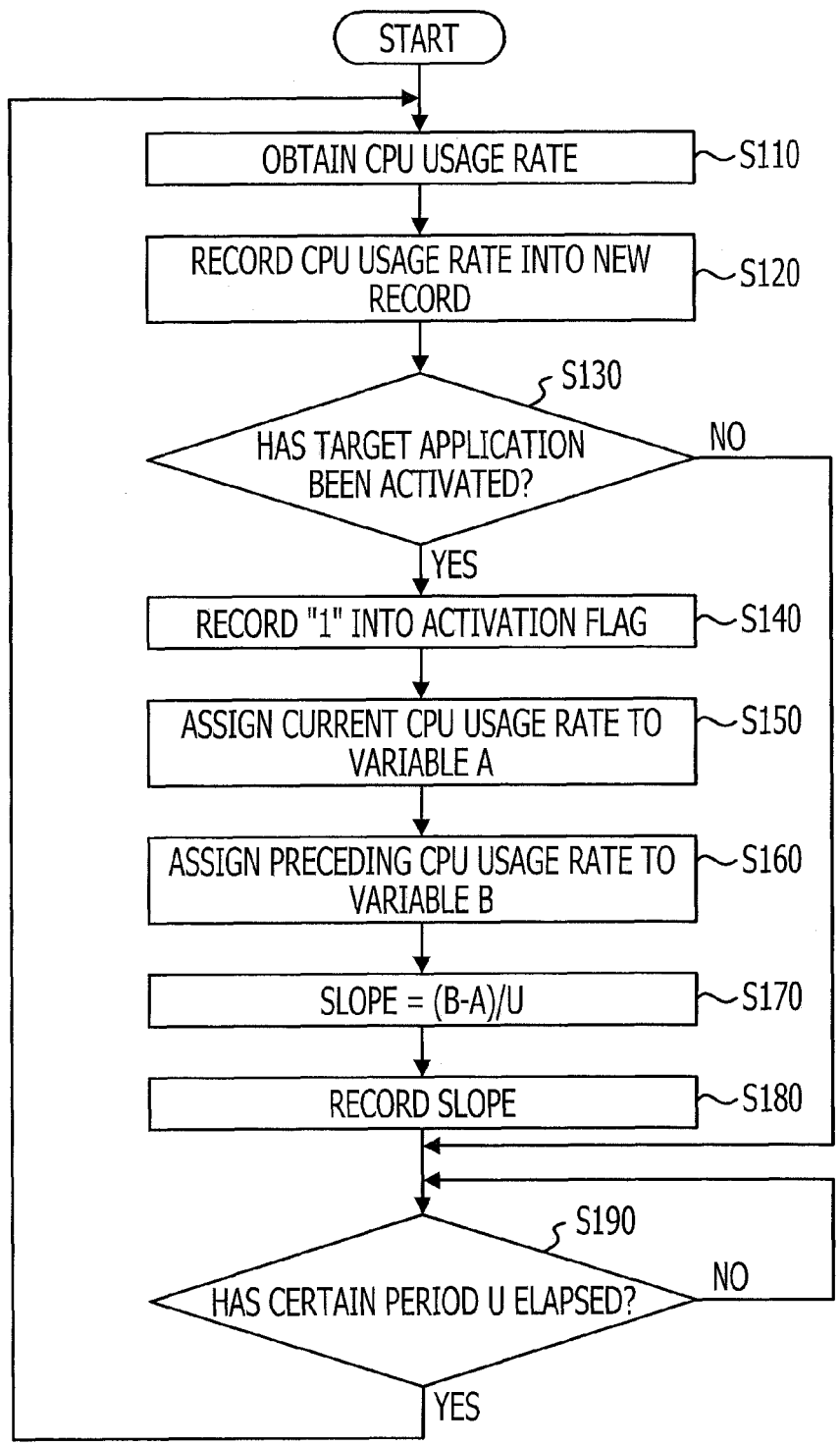
FIG. 6 illustrates an exemplary process of recording transition of a CPU usage rate.

FIG. 6 illustrates an exemplary process of recording transition of a CPU usage rate. The process illustrated in FIG. 6 may be started in accordance with activation of the information processing apparatus 10, or may be started in accordance with input of an instruction by a user.

In an operation S110, the load monitoring unit 11 obtains the CPU usage rate of the CPU 104 from, for example, an operating system (OS) of the information processing apparatus 10. The load monitoring unit 11 adds a new record (hereinafter referred to as a "current record") to the transition recording table 21, and records the obtained CPU usage rate into the current record (S120).

FIG. 7 illustrates an exemplary transition recording table. Each record in the transition recording table 21 may include fields for storing a number, an activation flag, a CPU usage rate, a slope, and so forth.

The number may be the identifier of each record. The number is automatically assigned in accordance with generation of a record. A number representing a recording order may be assigned as the number. The activation flag may be information representing whether or not a target application has been activated. For example, "1" may represent that a target application has been activated, and "0" may represent that a target application has not been activated. An initial value of the activation flag, for example, a value that is automatically set when a record is generated, may be "0". An activated application program that causes the function of predicting the remaining time of the battery 109 to be effective may be called a "target application". For example, in a state where a specific application program, such as a moving image playback application, has been activated, a user may be notified of the remaining time of the battery 109 during which the operation state of the application program lasts. The user may recognize the usable time of the application program that is currently in an activated state. When the target application is in an activated state, the function of predicting the remaining time of the battery 109 may be set to be effective. The function of predicting the remaining time of the battery 109 may be set to be effective when a specific application program is not in an activated state.

The CPU usage rate may correspond to the CPU usage rate recorded in the operation S120. The slope may be the slope of the CPU usage rate. The slope may be an amount of change in CPU usage rate in the period of obtaining the CPU usage rate.

In an operation S130, the load monitoring unit 11 determines whether or not a target application has been activated. For example, the load monitoring unit 11 may inquire of the OS of the information processing apparatus 10 to determine whether or not a target application has been activated. The identification information of a target application (for example, the name of an execution file) may be recorded in advance in the auxiliary storage device 102 so that the application program serving as a target application may be identified.

If a target application has not been activated (NO in the operation S130), the load monitoring unit 11 repeats the process from operation 5110 after a certain period U has elapsed (YES in an operation S190). The value of the certain period U may be recorded in advance in the auxiliary storage device 102, or may be input by a user after the information processing apparatus 10 has been activated. For example, the certain period U may be set to 10 m/s.

If a target application has been activated (YES in S130), the load monitoring unit 11 records "1" into the activation flag of the current record in an operation S140. In an operation S150, the load monitoring unit 11 obtains the current CPU usage rate from the current record, and assigns the obtained CPU usage rate to a variable A. In an operation S160, the load monitoring unit 11 obtains the CPU usage rate in the preceding record of the current record, and assigns the obtained CPU usage rate to a variable B. In an operation S170, the load monitoring unit 11 divides, by the certain period U, a value obtained by subtracting variable A from variable B, so as to calculate a slope. In an operation S180, the load monitoring unit 11 records the calculated slope into the field of slope in the current record. After the certain period U has elapsed (YES in the operation S190), the load monitoring unit 11 repeats the process from an operation S110.

The process illustrated in FIG. 6 is periodically executed, and information representing transition of the CPU usage rate is stored in the transition recording table 21.

Transition of an amount of power consumption (power value) is estimated using transition of a CPU usage rate. Thus, a process for causing a CPU usage rate to be within a range from a lower threshold to an upper threshold may be executed.

Figure 8:
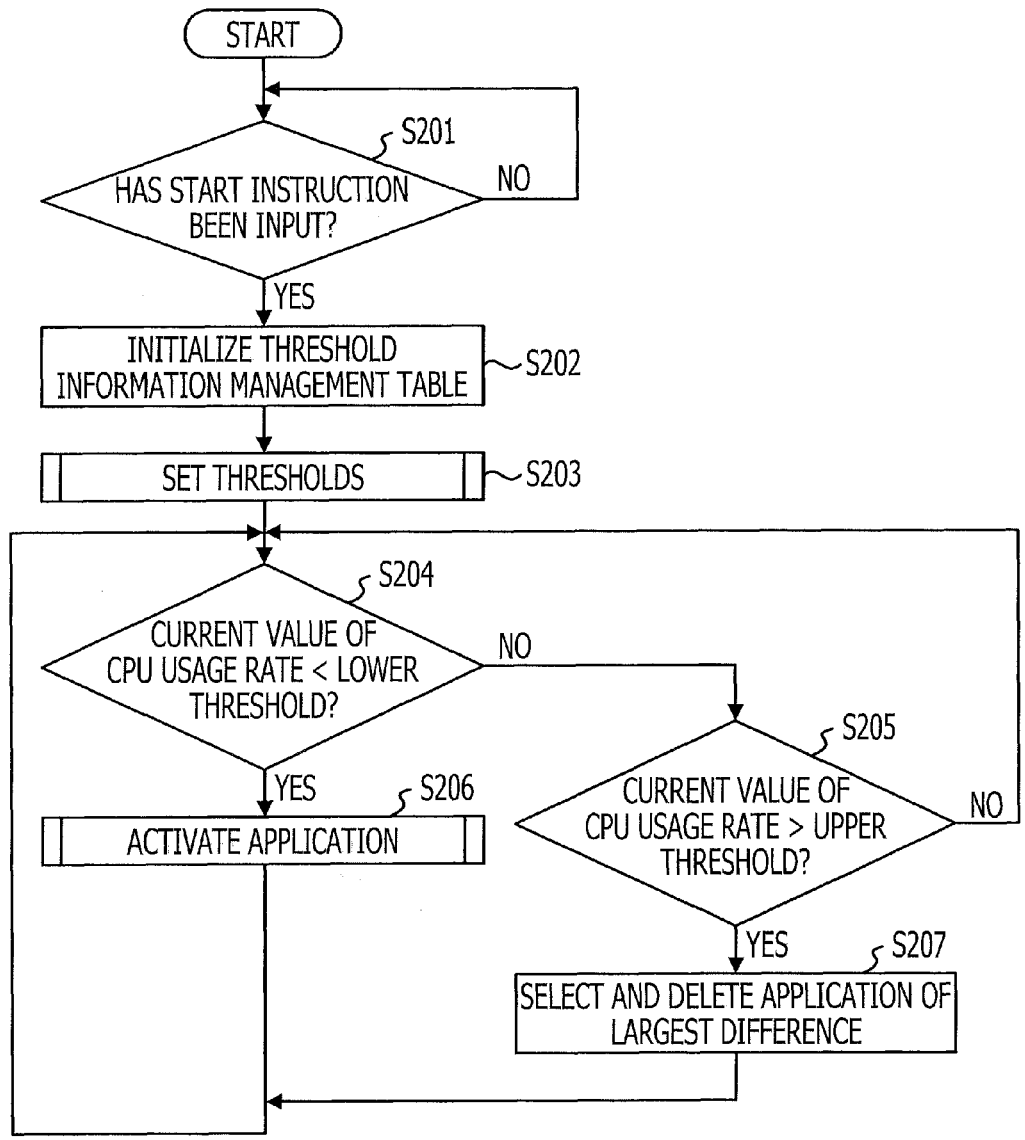
FIG. 8 illustrates an exemplary process of controlling transition of a CPU usage rate.

FIG. 8 illustrates an exemplary process of controlling transition of a CPU usage rate. For example, the control process illustrated in FIG. 8 may be executed in parallel with the process of recording transition of a CPU usage rate illustrated in FIG. 6.

For example, after an instruction to start prediction of the remaining time of the battery 109 has been input by a user (YES in an operation S201), the threshold determining unit 12 initializes the content of the threshold information management table 22 in an operation S202.

FIG. 9 illustrates an exemplary a threshold information management table. The threshold management table 22 includes fields for storing an upper threshold, a lower threshold, a lower threshold ratio, a threshold difference, and so forth.

The upper threshold and the lower threshold may be the upper threshold and the lower threshold of a CPU usage rate. The lower threshold ratio is a constant representing the ratio of the lower threshold to the upper threshold. The lower threshold may be determined based on the upper threshold. For example, the lower threshold is calculated by multiplying the upper threshold by the lower threshold ratio. The upper threshold may be calculated based on the lower threshold. The difference represents the difference between the upper threshold and the lower threshold.

In the operation S202 illustrated in FIG. 8, the values of the upper threshold, lower threshold, and difference may be initialized to null or zero. The value of the lower threshold ratio may be set in a fixed manner. The value input by the user in the operation S201 may be set in the operation S202.

In an operation 5203, the threshold determining unit 12 sets an upper threshold and a lower threshold. In the operation S203, an upper threshold, a lower threshold, and a difference are set into the threshold information management table 22.

In an operation S204, the transition control unit 13 determines whether or not the current value of the CPU usage rate is smaller than the lower threshold recorded in the threshold information management table 22. The current value of the CPU usage rate may be obtained by the OS in the operation S204. The CPU usage rate recorded in the last record of the transition recording table 21 may be used as the current value.

If the current value of the CPU usage rate is equal to or larger than the lower threshold (NO in the operation S204), the transition control unit 13 determines in operation S205 whether or not the current value exceeds the upper threshold recorded in the threshold information management table 22. In the operations S204 and S205, whether or not the current value of the CPU usage rate is within the range from the lower threshold to the upper threshold is determined.

If the current value of the CPU usage rate is equal to or smaller than the upper threshold (NO in the operation S205), the transition control unit 13 repeats the process from the operation S204. Whether or not the CPU usage rate is within the range from the lower threshold to the upper threshold is continuously monitored.

If the current value of the CPU usage rate is detected as being smaller than the lower threshold (YES in the operation S204), the transition control unit 13 activates an application in an operation S206. The transition control unit 13 increases the CPU usage rate by activating the application, so as to set the CPU usage rate to be within the range from the lower threshold to the upper threshold.

The amount of power consumption, for example, the CPU usage rate, for setting the CPU usage rate to be within the range from the lower threshold to the upper threshold increases.

FIG. 10 illustrates an exemplary application-load correlation table. In the application-load correlation table 23, an application name and a difference value are registered for each application program.

In the operation S206 illustrated in FIG. 8, the application to be activated may be selected based on the application-load correlation table 23 illustrated in FIG. 10.

The application name may be identification information used for activating the application program, for example, the name of an execution file of the application program. The difference value may be an amount of increase in CPU usage rate when the application program is activated. The difference value is measured in advance and is registered in the application-load correlation table 23. The application program registered in the application-load correlation table 23 may not have a practical function. For example, a program for increasing a load (CPU usage rate) may be registered. "Application" of "application program" does not limit a program function.

A difference value of an application program registered in the application-load correlation table 23 may be updated based on the amount of increase in CPU usage rate that is measured in accordance with activation of the application program.

If the current value of the CPU usage rate is detected as having exceeded the upper threshold (YES in the operation S205), the transition control unit 13 stops, in an operation S207 illustrated in FIG. 8, the process of the application program having the largest difference value registered in the application-load correlation table 23 among the application programs activated in the operation S206. Accordingly, the CPU usage rate may be decreased to be equal to or lower than the upper threshold. When the CPU usage rate is lower than the lower threshold due to the stop of the process of the application program, the operation S206 may be executed. Accordingly, the CPU usage rate is set to be within the range from the lower threshold to the upper threshold. In the operation S207, an application program having a difference value registered in the application-load correlation table 23, the difference value causing a value obtained by subtracting the difference value from the current value of the CPU usage rate to be equal to or larger than the lower threshold and to be equal to or smaller than the upper threshold, may be stopped.

Figure 11A:
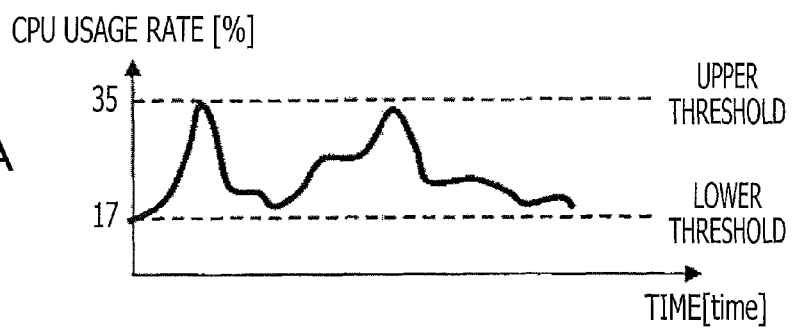
FIGS. 11A to 11C illustrate an exemplary transition of a CPU usage rate.
Figure 11B:
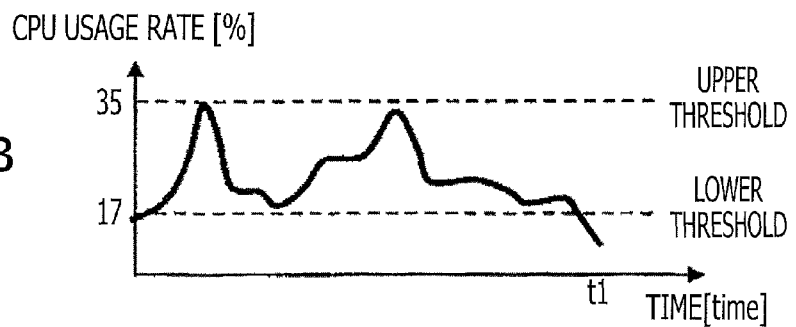
Figure 11C:
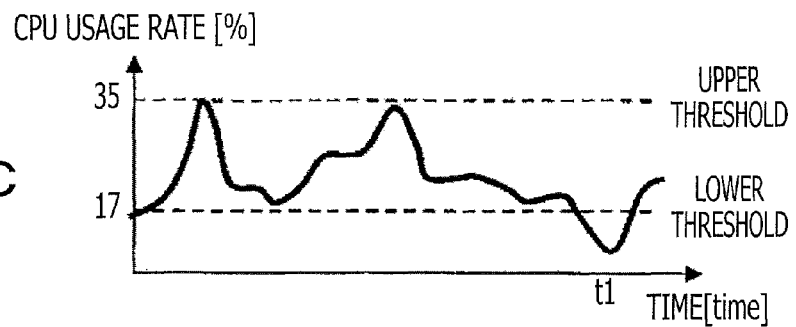

FIGS. 11A to 11C illustrate an exemplary transition of a CPU usage rate. The transition of a CPU usage rate illustrated in FIGS. 11A to 11C may correspond to the result of the process illustrated in FIG. 8. In FIG. 11A, an upper threshold (35%) and a lower threshold (8.75%) are set through the execution of the operation S203 illustrated in FIG. 8. The transition of a CPU usage rate illustrated in FIGS. 11A to 11C may be transition of a CPU usage rate that is to be recorded in the transition recording table 21.

At time t1 in FIG. 11B, the current value of the CPU usage rate is detected as being smaller than the lower threshold (YES in the operation S204 illustrated in FIG. 8). In the operation S206 illustrated in FIG. 8, an application program is activated.

As illustrated in FIG. 11C, the CPU usage rate is set to be within the range from the lower threshold to the upper threshold.

Figure 12:
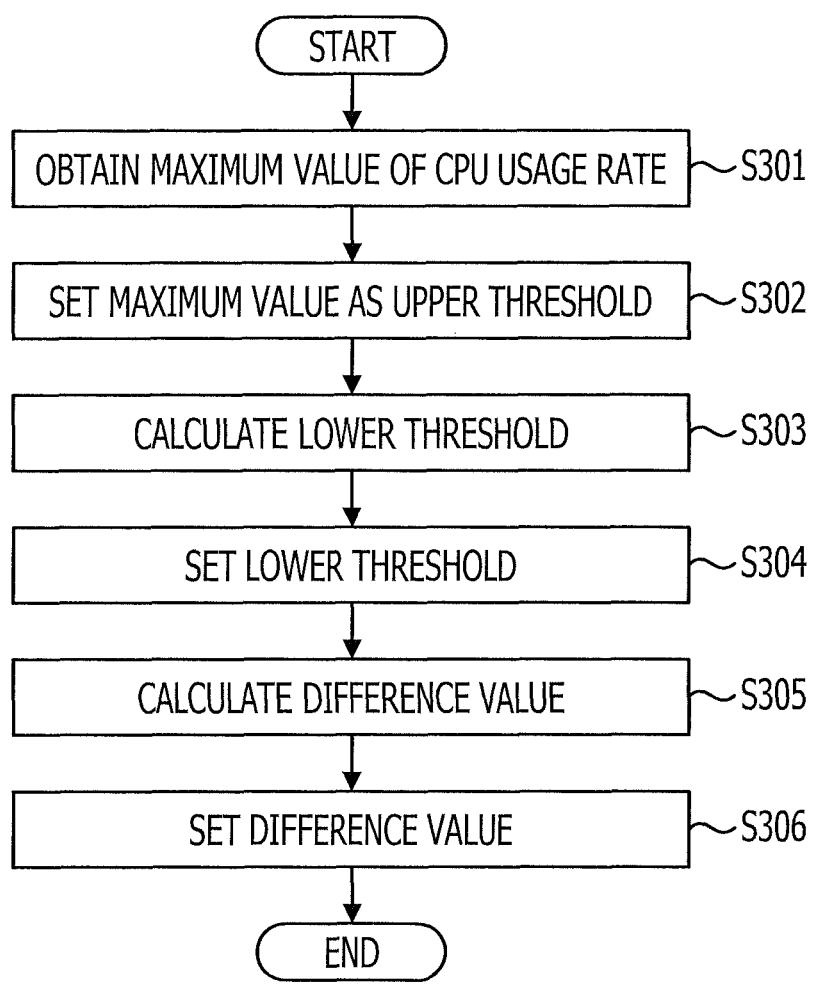
FIG. 12 illustrates an exemplary threshold setting process.

FIG. 12 illustrates an exemplary threshold setting process. The threshold setting process illustrated in FIG. 12 may correspond to the operation S203 illustrated in FIG. 8.

In an operation S301, the threshold determining unit 12 specifies the maximum value of the CPU usage rate by referring to the transition recording table 21. For example, the threshold determining unit 12 specifies the maximum value of the CPU usage rates in individual records in which "1" is recorded as an activation flag in the transition recording table 21. A search range for the maximum value may be set. For example, the maximum value of the CPU usage rates in the records of the last three seconds may be specified. A past peak value, for example, a temporary peak value of a CPU usage rate generated when an application is activated, may be excluded from candidates of the maximum value. The maximum value of the CPU usage rate in a state where the load of the information processing apparatus 10 is stable may be specified.

In an operation S302, the threshold determining unit 12 sets the maximum value specified in the operation S301 into the threshold information management table 22. The maximum value serves as an upper threshold. In an operation S303, the threshold determining unit 12 multiplies the upper threshold by the lower threshold ratio set in the threshold information management table 22, so as to calculate a lower threshold. In an operation S304, the threshold determining unit 12 sets (or registers) the lower threshold calculated in the operation S303 into the threshold information management table 22.

In an operation S305, the threshold determining unit 12 calculates the difference value between the upper threshold and the lower threshold. The difference value is calculated by subtracting the lower threshold from the upper threshold. In an operation S306, the threshold determining unit 12 sets the calculated difference value into the threshold information management table 22.

Figure 13:
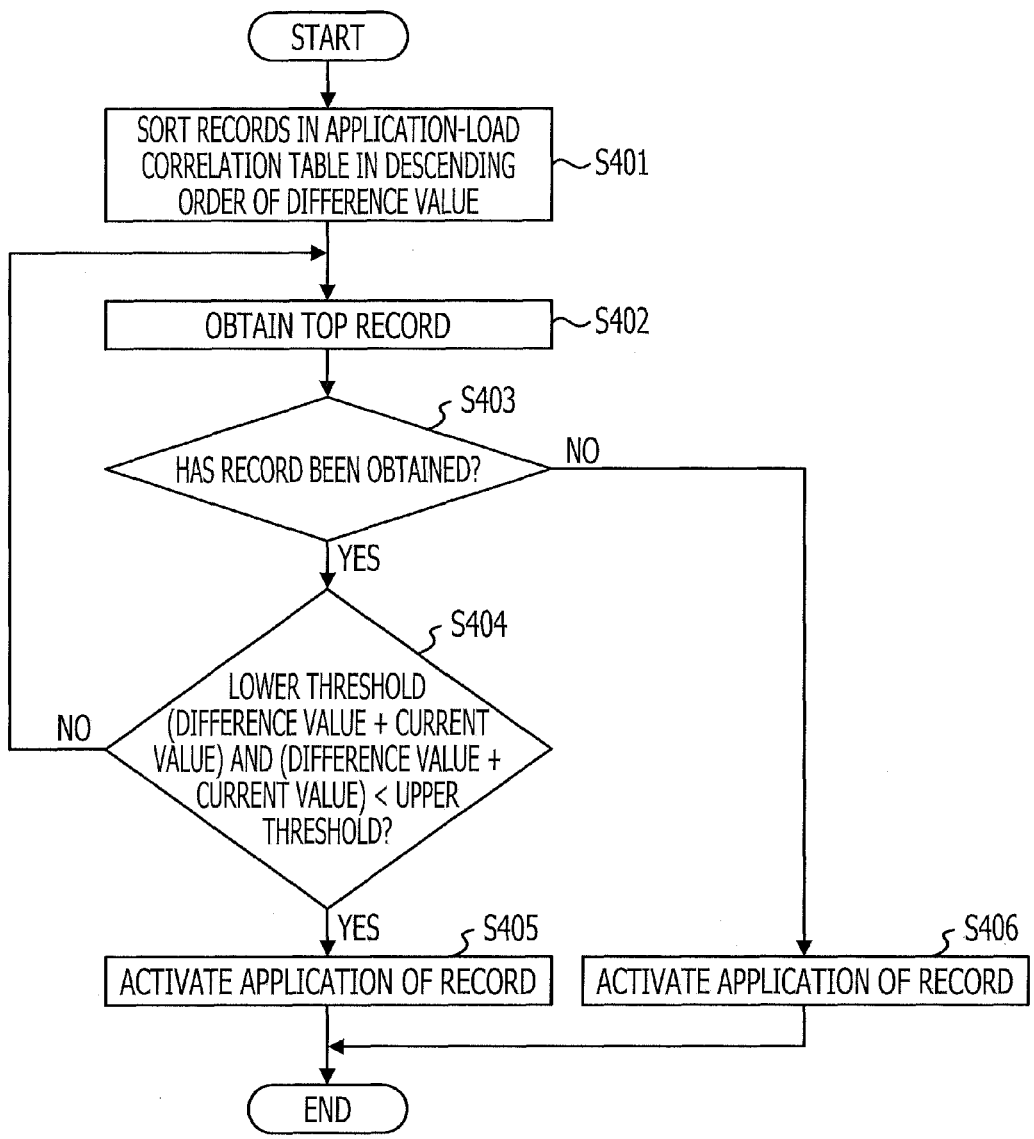
FIG. 13 illustrates an exemplary process of activating an application program.

FIG. 13 illustrates an exemplary process of activating an application program. The process of activating an application program illustrated in FIG. 13 may correspond to the operation S206 illustrated in FIG. 8.

In an operation S401, the transition control unit 13 sorts the records in the application-load correlation table 23 illustrated in FIG. 10 in descending order of the difference value. In an operation S402, the transition control unit 13 obtains the record at the top of the application-load correlation table 23. If a record has been obtained, for example, if there is an unprocessed record (YES in an operation S403), the transition control unit 13 determines in an operation S404 whether or not the application the name of which is registered in the obtained record is suitable as a target to be activated. For example, the transition control unit 13 determines whether or not the value obtained by adding the difference value in the record to the current value of the CPU usage rate is equal to or larger than the lower threshold and is smaller than the upper threshold. The transition control unit 13 determines whether or not the CPU usage rate is set to be within the range from the lower threshold to the upper threshold when the application is activated.

If the value obtained by adding the difference value in the record to the current value of the CPU usage rate is equal to or larger than the lower threshold and is smaller than the upper threshold (YES in the operation S404), the transition control unit 13 activates the application program corresponding to the record in an operation S405. The CPU usage rate may increase, and the CPU usage rate under the lower threshold may be set to be within the range from the lower threshold to the upper threshold. When there are a plurality of added records, a plurality of application programs may be activated.

If the value obtained by adding the difference value in the record to the current value of the CPU usage rate is smaller than the lower threshold or is equal to or larger than the upper threshold (NO in the operation S404), the transition control unit 13 obtains the next record in the sort order in the operation S402, and repeats the process from the operation S403.

If there is no application that satisfies the condition of the operation S404 even if a record in the application-load correlation table 23 is obtained (NO in the operation S403), the transition control unit 13 activates, for example, a loop process of increasing the CPU usage rate in an operation S406.

When a plurality of application programs are activated, two or more application programs may be selected so that the total sum of the sum of the difference values of the application programs and the current value of the CPU usage rate is within the range from the lower threshold to the upper threshold.

A difference value to be obtained when a plurality of application programs are contemporaneously activated may be recorded in the application-load correlation table 23 in advance for each combination of two or more application programs.

Figure 14:
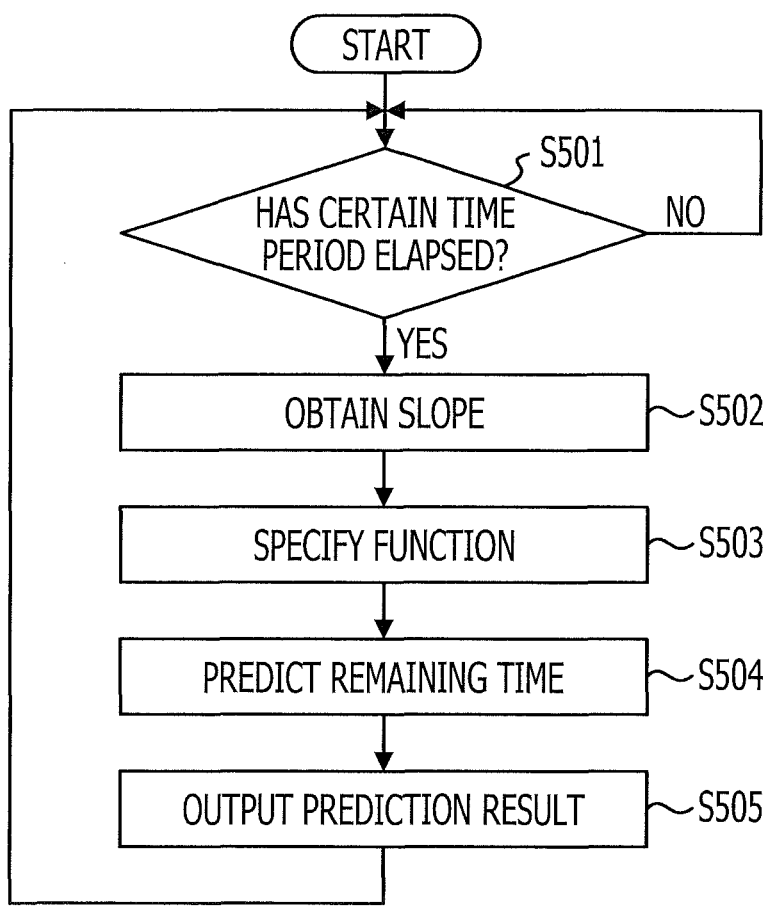
FIG. 14 illustrates an exemplary process of predicting remaining battery time.

FIG. 14 illustrates an exemplary process of predicting remaining battery time. The process illustrated in FIG. 14 may be executed in parallel with the process illustrated in FIG. 6 or FIG. 8, for example. The process illustrated in FIG. 14 may be started at substantially the same time as the process illustrated in FIG. 8, or may be started after a certain time period has elapsed from the start of the process illustrated in FIG. 8.

In an operation S501, the predicting unit 14 waits for a certain time period. The predicting unit 14 may wait until the CPU usage rate is set to be within the range from the lower threshold to the upper threshold by the transition control unit 13.

In an operation S502, the predicting unit 14 obtains the value of slope at the bottom of the transition recording table 21 illustrated in FIG. 7, for example, the value of slope in the latest record. In an operation S503, the predicting unit 14 obtains a function to be used for prediction from the function table 24 based on the obtained slope.

FIG. 15 illustrates an exemplary function table. In the function table 24, a function is registered for each slope of the CPU usage rate. In an operation S503 illustrated in FIG. 14, the predicting unit 14 obtains the prediction function corresponding to the slope. The equations of the functions illustrated in FIG. 15 are not limited. An equation of a function may be set based on an experiment or the like. A function may include a term representing remaining time.

In an operation S504, the predicting unit 14 calculates a predicted value of remaining time of the battery 109 based on the function. For example, the predicting unit 14 calculates a predicted value of remaining time by solving, regarding the term representing the remaining time, an equation in which values depending on the current situation of the information processing apparatus 10 are set to individual parameters included in the function.

In an operation S505, the predicting unit 14 outputs the calculated predicted value of remaining time. For example, the predicted value may be displayed on the display device 106. The predicted value may be represented by a numeric value or figure.

Figure 16:
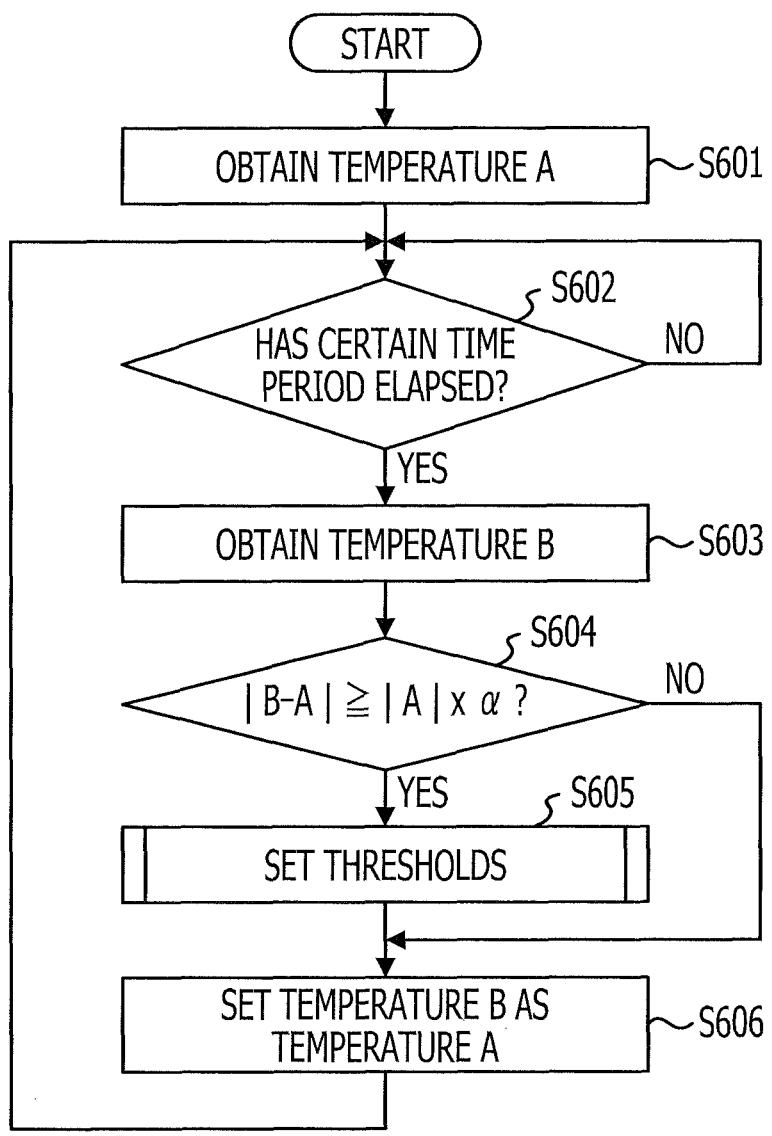
FIG. 16 illustrates an exemplary process of changing thresholds.

FIG. 16 illustrates an exemplary process of changing thresholds. Thresholds may be changed in accordance with change in temperature. The process illustrated in FIG. 16 may be executed in parallel with the process illustrated in FIG. 6, FIG. 8, or FIG. 14. The process illustrated in FIG. 16 may be started at substantially the same time as the process illustrated in FIG. 8, for example.

In an operation S601, the temperature monitoring unit 15 obtains temperature (hereinafter referred to as "temperature A") from the temperature sensor 108 after activation. In an operation S602, the temperature monitoring unit 15 waits for a certain time period. The certain time period may be a period of monitoring temperature. As the certain time period becomes shorter, change in temperature may be detected more immediately and a processing load may be increased. The certain time period may be set in view of a delay of detection of change in temperature and a processing load.

After the certain time period has elapsed, in an operation S603, the temperature monitoring unit 15 obtains temperature (hereinafter referred to as "temperature B") from the temperature sensor 108. In an operation S604, the temperature monitoring unit 15 determines whether or not a significant change in temperature has occurred. For example, the temperature monitoring unit 15 determines whether or not the absolute value of the difference between temperature A and temperature B is equal to or larger than a value obtained by multiplying the absolute value of temperature A by $\alpha$. $\alpha$ may be a constant smaller than one. For example, the degree of change in temperature may be represented by a ratio with respect to temperature A before change. For example, when 20% of temperature A before change is set as significant change in temperature, the value of a may be 0.2. Significant change in temperature may be set as an absolute value. For example, when a change of three degrees or more is set as significant change in temperature, it may be determined in the operation S604 whether or not the absolute value of the difference between temperature A and temperature B is three or more.

If significant change in temperature occurs (YES in the operation S604), the temperature monitoring unit 15 causes the threshold determining unit 12 to execute the process of calculating thresholds illustrated in FIG. 12 in an operation S605. The upper threshold, the lower threshold, and the difference value in the threshold information management table 22 are updated. An upper threshold, a lower threshold, and a difference value that are suitable for the current temperature are set into the threshold information management table 22.

If significant change in temperature does not occur (NO in the operation S604), the process of calculating thresholds may not be executed.

In an operation S606, the temperature monitoring unit 15 sets the current temperature B as temperature A, and repeats the process from operation S602.

Figure 17A:
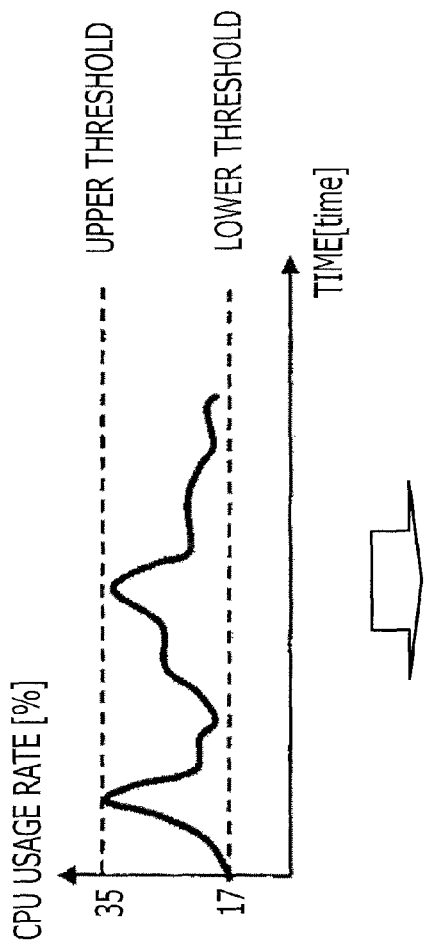
FIGS. 17A and 17B illustrate an exemplary change in thresholds.
Figure 17B:
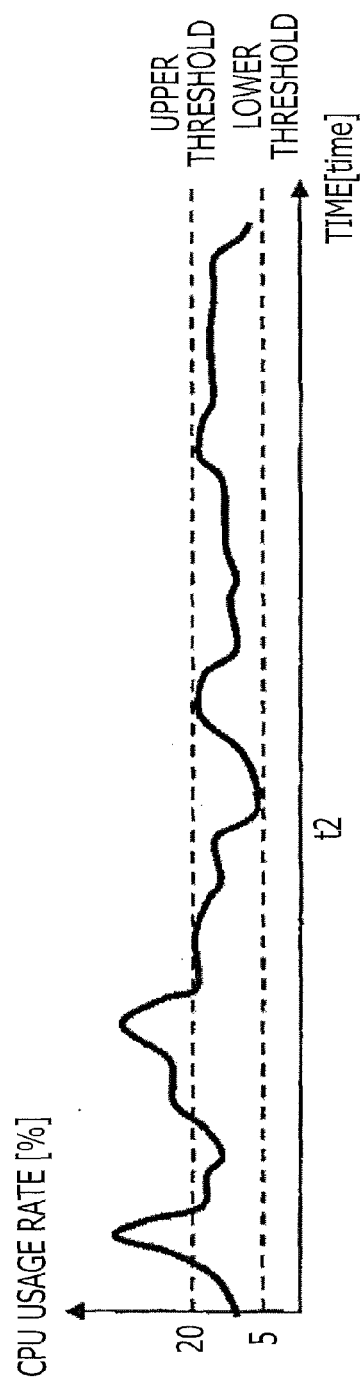

FIGS. 17A and 17B illustrate an exemplary change in thresholds. The thresholds may be changed in accordance with change in temperature. The change in temperature may be change in temperature that satisfies the condition of the operation S604 illustrated in FIG. 16.

FIG. 17A illustrates transition of a CPU usage rate before temperature changes. In FIG. 17A, the upper threshold may be set to 35%, and the lower threshold may be set to 8.75%.

The curve after time t2 illustrated in FIG. 17B represents transition of the CPU usage rate after the temperature significantly decreases at time t2. The decrease in temperature causes a temporary decrease in output of the battery 109 and a decrease in CPU usage rate. Calculation of thresholds may be performed in that state, and the upper threshold may be changed to 20%, and the lower threshold may be changed to 5%. Accordingly, the CPU usage rate is set to be within the range of thresholds illustrated in FIG. 17B, and activation of applications may be decreased. The thresholds set based on the outside temperature may be maintained, and an increase in load, for example, consumption of the battery, may be decreased.

A power consumption value may correspond to a magnitude of a load of the information processing apparatus 10. The above-described CPU usage rate may be replaced with a power value.

Figure 18:
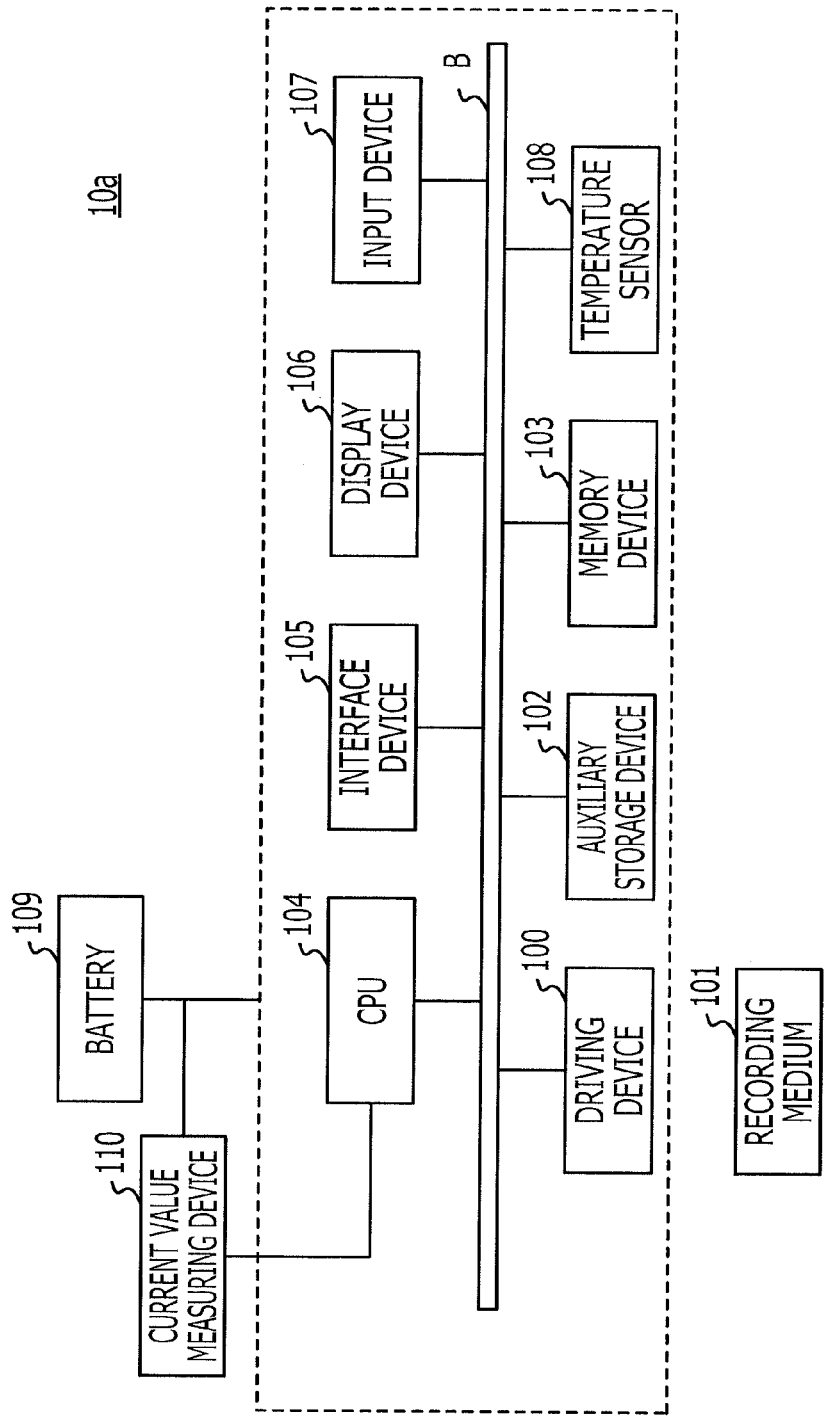
FIG. 18 illustrates an exemplary information processing apparatus.

FIG. 18 illustrates an exemplary information processing apparatus. In FIG. 18, the elements that are substantially the same as or similar to the elements illustrated in FIG. 4 may be denoted by the same reference numerals, and the corresponding description may be omitted or reduced.

The information processing apparatus 10a illustrated in FIG. 18 includes a current value measuring device 110. The current value measuring device 110 measures the value of current supplied from the battery 109 (current value). The current value may be recorded in a register included in the CPU 104, for example.

Figure 19:
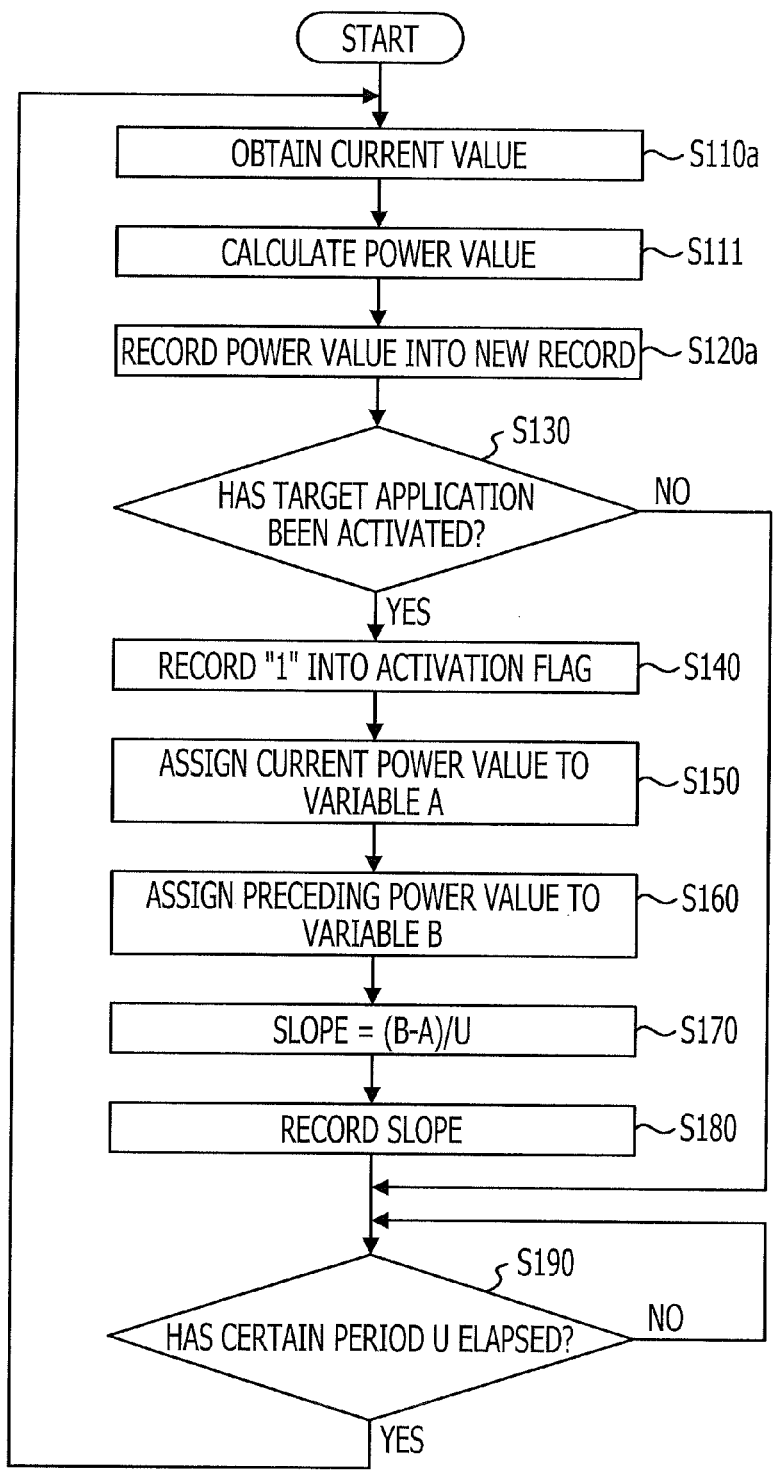
FIG. 19 illustrates an exemplary process of recording transition of an amount of power consumption.

FIG. 19 illustrates an exemplary process of recording transition of an amount of power consumption. In FIG. 19, the elements that are substantially the same as or similar to the elements illustrated in FIG. 6 may be denoted by the same reference numerals, and the corresponding description may be omitted or reduced. In FIG. 19, the operation S110 is replaced with an operation S110a, and an operation S111 is added.

In the operation S110a, the load monitoring unit 11 obtains a current value supplied from the battery 109. The current value is recorded in the register of the CPU 104, for example. The current value may be obtained from the register.

In the operation S111, the load monitoring unit 11 multiplies the obtained current value by the voltage (power supply voltage) of the battery 109, so as to calculate the power value of power consumption.

An operation S120 and the operations subsequent thereto may be substantially the same as or similar to the operations illustrated in FIG. 6. The CPU usage rate is replaced with the power value. Power values may be recorded in the field in which CPU usage rates are recorded in the transition recording table 21 illustrated in FIG. 7.

Figure 20:
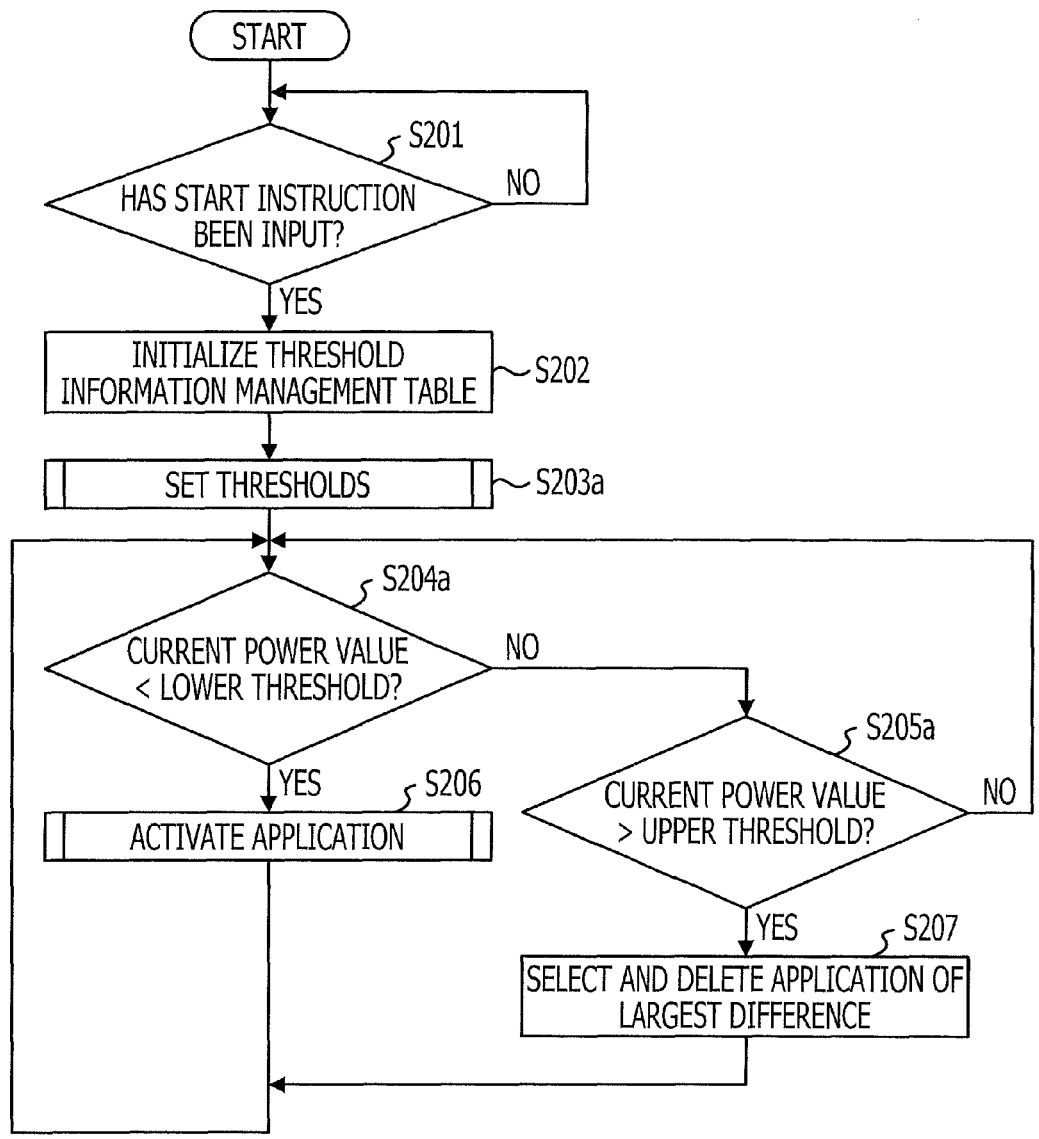
FIG. 20 illustrates an exemplary process of controlling transition of a power value.

FIG. 20 illustrates an exemplary process of controlling transition of a power value. In FIG. 20, the elements that are substantially the same as or similar to the elements illustrated in FIG. 8 may be denoted by the same reference numerals, and the corresponding description may be omitted or reduced. In FIG. 20, the operations S203, S204, and S205 are replaced with operations S203a, S204a, and S205a, respectively.

In the operation S203a, the threshold determining unit 12 calculates an upper threshold and a lower threshold of a power value. In the operation S203a, values are set into the fields of upper threshold, lower threshold, and difference in the threshold information management table 22. The values related to a power value may be set into the fields of upper threshold, lower threshold, and difference in the threshold information management table 22.

In the operation S204a, the transition control unit 13 determines whether or not the current power value is smaller than the lower threshold recorded in the threshold information management table 22. The current power value may be obtained from the last record in the transition recording table 21.

If the current power value is equal to or larger than the lower threshold (NO in the operation S204a), the transition control unit 13 determines in the operation S205a whether or not the current power value exceeds the upper threshold recorded in the threshold information management table 22. For example, in the operations S204a and S205a, the transition control unit 13 may determine whether or not the current power value is within the range from the lower threshold to the upper threshold.

In an operation S206, an application may be activated to set the power value to be within the range from the lower threshold to the upper threshold. For example, difference values of power values may be recorded in the field for recording difference values of CPU usage rates in the application-load correlation table 23 illustrated in FIG. 10.

FIG. 21 illustrates an exemplary threshold setting process. In FIG. 21, the elements that are substantially the same as or similar to the elements illustrated in FIG. 12 may be denoted by the same reference numerals, and the corresponding description may be omitted or reduced. In FIG. 21, the operation S301 may be replaced with an operation S301a.

In the operation S301a, the threshold determining unit 12 specifies the maximum value of the power value by referring to the transition recording table 21. The method for specifying the maximum value of the power value may be substantially the same as or similar to the method for specifying the maximum value of the CPU usage rate in the operation S301 illustrated in FIG. 12.

An operation S302 and the operations subsequent thereto may be substantially the same as or similar to the operations illustrated in FIG. 12. A power value may be used as a target to be processed instead of a CPU usage rate.

The remaining time of the battery 109 may be predicted by using a power value, instead of using a CPU usage rate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing apparatus driven by a battery, comprising:
   a processor configured to execute a predicting program; and
   a memory configured to store the predicting program,
   wherein the processor performs, based on the predicting program, operations to:
      record a value representing a magnitude of a load of the information processing apparatus;
      select a program to be activated from a plurality of programs based on an amount of increase in the load caused by activation of the program, when the value is smaller than a lower threshold;
      calculate remaining time of the battery by using a function associated with a slope representing change in the value;
      monitor temperature outside the information processing apparatus; and
      update the lower threshold when an amount of change in the temperature exceeds a certain value.

2. The information processing apparatus according to claim 1, wherein the operations further include:

stopping the program in an activated state when the value exceeds an upper threshold.

3. The information processing apparatus according to claim 2, wherein the operations further include:
controlling the value so as to be within a range between the lower threshold value and the upper threshold value.

4. The information processing apparatus according to claim 1, wherein the operations further include:
storing an amount of increase in the load for each of the plurality of programs.

5. The information processing apparatus according to claim 1, wherein the operations further include:
periodically recording the value representing the magnitude of the load.

6. The information processing apparatus according to claim 5, wherein the operations further include:
determining the lower threshold based on a recorded value.

7. A method comprising:
executing, by an information processing apparatus, operations including:
recording a value representing a magnitude of a load of the information processing apparatus;
selecting a program to be activated from a plurality of programs based on an increase in the load caused by activation of the program, when the value is smaller than a lower threshold;
calculating remaining time of a battery that drives the information processing apparatus by using a function associated with a slope representing change in the value;
monitoring temperature outside the information processing apparatus; and
updating the lower threshold when an amount of change in the temperature exceeds a certain value.

8. The method according to claim 7, wherein the operations further include:
stopping the program in an activated state when the value exceeds an upper threshold.

9. The method according to claim 8, wherein the operations further include:
controlling the value to be within a range between the lower threshold value and the upper threshold value.

10. The method according to claim 7, wherein the selecting is performed by referring to a storage unit configured to store an amount of increase in the load for each of the plurality of programs.

11. The method according to claim 7, wherein the operations further include:
periodically recording the value representing the magnitude of the load.

12. The method according to claim 11, wherein the operations further include:
determining the lower threshold based on a recorded value.

13. An apparatus driven by a battery, the apparatus comprising:
at least one memory storing instructions; and
at least one processor coupled to the at least one memory so that, when the instructions stored in the at least one memory are executed by the at least one processor, the at least one processor causes the following operations to be performed by the apparatus:
monitoring a value representing a magnitude of a load of the apparatus,
selecting a program to be activated from a plurality of programs based on an increase in the load caused by activation of the program, when the monitored value is less than a lower threshold of a range of the magnitude of the load,
calculating a remaining time of the battery by using a function associated with a slope representing change in the value,
monitoring temperature outside the apparatus, and
updating the lower threshold when an amount of change in the monitored temperature exceeds a predetermined value.

14. The apparatus according to claim 13, wherein the apparatus is a mobile phone.

15. The apparatus according to claim 13, wherein the apparatus is a smart phone.

* * * * *

UNITED STATES PATENT AND TRADEMARK OFFICE
CERTIFICATE OF CORRECTION

Page 1 of 1

PATENT NO. : 9,037,427 B2
APPLICATION NO. : 13/439054
DATED : May 19, 2015
INVENTOR(S) : Tatsuya Yamamoto It is certified that error appears in the above-identified patent and that said Letters Patent is hereby corrected as shown below:

In the Claims

Column 12, Line 56, In Claim 1, after "an" delete "amount of".

Signed and Sealed this
Eighteenth Day of August, 2015

Michelle K. Lee
*Director of the United States Patent and Trademark Office*